(12) United States Patent
Uejima (10) Patent No.: US 10,211,829 B2
(45) Date of Patent: Feb. 19, 2019

(54) SEMICONDUCTOR SWITCH AND COMMUNICATION MODULE

(71) Applicant: KABUSHIKI KAISHA TOSHIBA, Tokyo (JP)

(72) Inventor: Koji Uejima, Yamato Kanagawa (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 324 days.

(21) Appl. No.: 15/243,841

(22) Filed: Aug. 22, 2016

(65) Prior Publication Data

US 2017/0272070 A1   Sep. 21, 2017

(30) Foreign Application Priority Data

Mar. 16, 2016 (JP) ................. 2016-052442

(51) Int. Cl.
| | |
|---|---|
| *H02J 1/00* | (2006.01) |
| *H03K 17/693* | (2006.01) |
| *H02J 1/02* | (2006.01) |
| *H02J 3/01* | (2006.01) |

(52) U.S. Cl.
CPC .............. *H03K 17/693* (2013.01); *H02J 1/02* (2013.01); *H02J 3/01* (2013.01); *Y02E 40/40* (2013.01)

(58) Field of Classification Search
CPC ..................................... H02J 1/02; H02J 3/01
See application file for complete search history.

(56) References Cited

U.S. PATENT DOCUMENTS

| | | | |
|---|---|---|---|
| 6,407,614 B1 | 6/2002 | Takahashi | |
| 2009/0181630 A1 | 7/2009 | Seshita et al. | |
| 2010/0253445 A1* | 10/2010 | Ando ........................ | H01P 1/15 333/101 |
| 2015/0381168 A1 | 12/2015 | Uejima | |

FOREIGN PATENT DOCUMENTS

| | | | |
|---|---|---|---|
| JP | 08213802 A | * | 8/1996 |
| JP | 2002-176375 A | | 6/2002 |
| JP | 2009194891 A | | 8/2009 |
| JP | 2016010045 A | | 1/2016 |

* cited by examiner

*Primary Examiner* — Fritz M Fleming (74) *Attorney, Agent, or Firm* — Patterson & Sheridan, LLP (57) ABSTRACT

A semiconductor switch includes a first switching element connected between a first terminal and a second terminal, a second switching element connected between the second terminal and a third terminal, a first resonant circuit having a zero impedance when resonating at a first frequency, a second resonant circuit having a zero impedance when resonating at N times the first frequency, wherein N is an integer greater than 1, and a transmission line having a first point connected to the second terminal, a second point connected to the first resonant circuit, and a third point connected to the second resonant circuit. A length of the transmission line between the first and second points corresponds to one-quarter of a wavelength corresponding to the first frequency, and a length of the transmission line between the first and third points corresponds to one-half of the wavelength corresponding to the first frequency divided by N.

16 Claims, 6 Drawing Sheets

SEMICONDUCTOR SWITCH AND COMMUNICATION MODULE

CROSS-REFERENCE TO RELATED APPLICATION

This application is based upon and claims the benefit of priority from Japanese Patent Application No. 2016-052442, filed on Mar. 16, 2016, the entire contents of which are incorporated herein by reference.

FIELD

Embodiments described herein relate generally to a semiconductor switch and a communication module.

BACKGROUND

A mobile communication apparatus such as a cellular phone transmits and receives a high frequency signal at an antenna terminal thereof. Transmission and reception of the high frequency signal are switched by using, for example, a switching element. There is a case where, for example, a metal oxide semiconductor (MOS) transistor with a gate structure of a MOS type is used for the switching element. In this case, when the high frequency signal is transmitted or received, there is a concern that the high frequency signal may include second harmonic components or third harmonic components.

DETAILED DESCRIPTION

According to an embodiment, there is provided a semiconductor switch and a communication module which can reduce harmonic components.

In general, according to one embodiment, a semiconductor switch includes a first switching element connected between a first terminal and a second terminal, a second switching element connected between the second terminal and a third terminal, a first resonant circuit having a zero impedance when resonating at a first frequency, a second resonant circuit having a zero impedance when resonating at N times the first frequency, wherein N is an integer greater than 1, and a transmission line having a first point connected to the second terminal, a second point connected to the first resonant circuit, and a third point connected to the second resonant circuit, wherein a first length of the transmission line between the first and second points corresponds to one-quarter of a wavelength corresponding to the first frequency, and a second length of the transmission line between the first and third points corresponds to one-half of the wavelength corresponding to the first frequency divided by N.

Hereinafter, the embodiment will be described with reference to the accompanying drawings. The present disclosure does not limit to the embodiment.

First Embodiment

Figure 1:
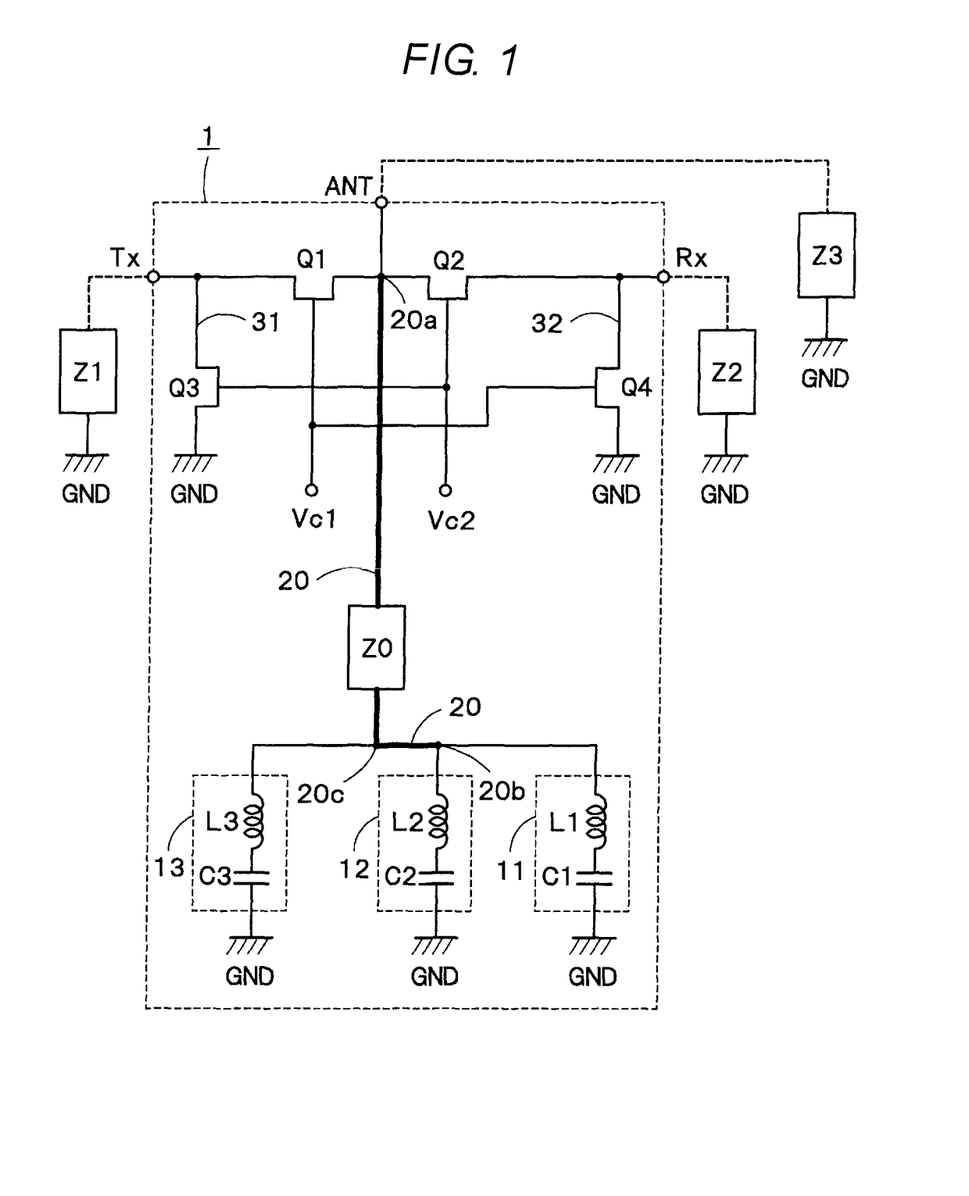
FIG. 1 is a circuit diagram illustrating a schematic configuration of a semiconductor switch according to a first embodiment.
Figure 2:
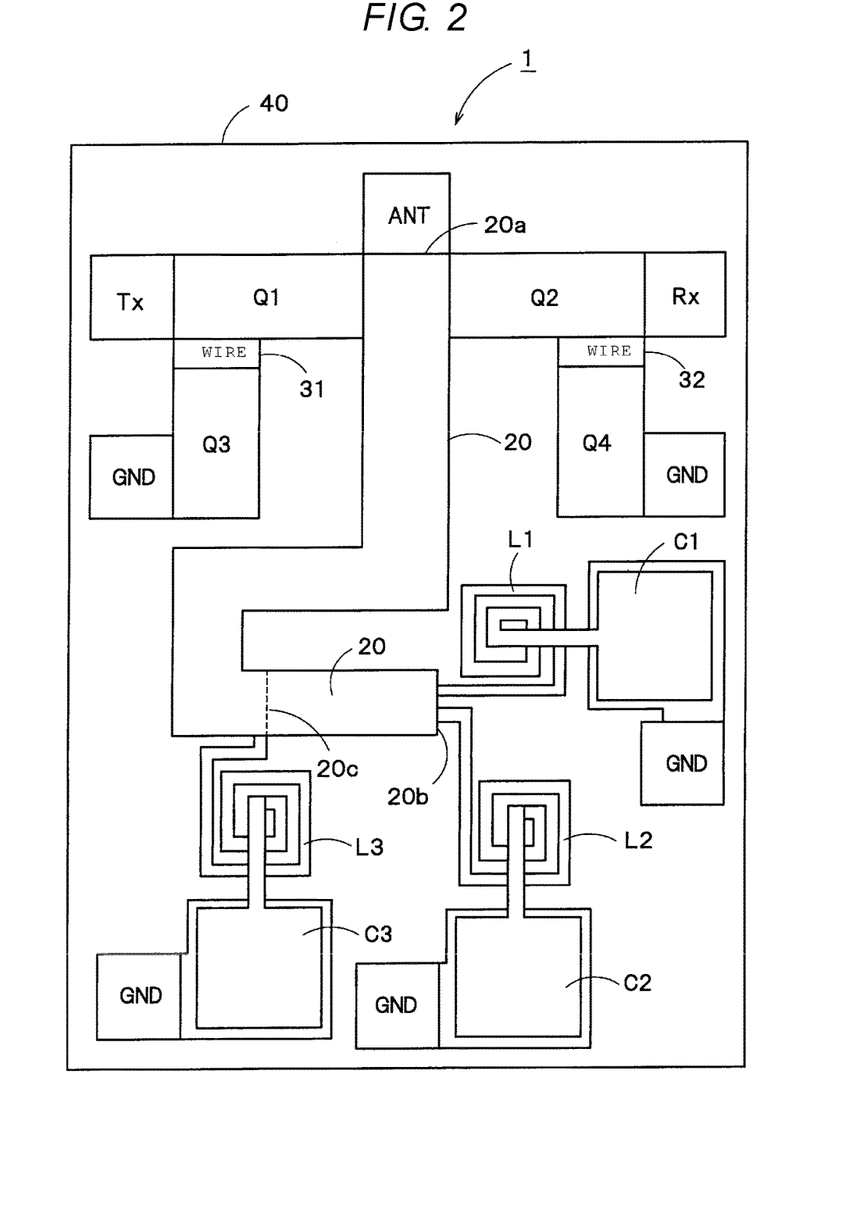
FIG. 2 is a schematic layout diagram of the semiconductor switch illustrated in FIG. 1.

FIG. 1 is a circuit diagram illustrating a schematic configuration of a semiconductor switch according to a first embodiment. In addition, FIG. 2 is a schematic layout diagram of the semiconductor switch illustrated in FIG. 1.

As illustrated in FIG. 1, a semiconductor switch 1 according to the present embodiment includes switching elements Q1 to Q4, resonant circuits 11 to 13, and a transmission line 20. In the semiconductor switch 1, the switching element Q1 corresponds to a first switching element, and the switching element Q2 corresponds to a second switching element. In addition, the resonant circuit 11 corresponds to a first resonant circuit, the resonant circuit 12 corresponds to a second resonant circuit, and the resonant circuit 13 corresponds to a third resonant circuit. The semiconductor switch 1 may include any one of the resonant circuit 12 and the resonant circuit 13.

The switching element Q1 is provided between an input terminal Tx and an antenna terminal ANT. The input terminal Tx corresponds to a first terminal to which a high frequency signal set to a frequency f0 (first frequency) is input from a transmission circuit (not illustrated). In addition, the antenna terminal ANT corresponds to a second terminal which transmits the high frequency signal that is input to the input terminal Tx, or receives the high frequency signal that is transmitted from an external device. The frequency f0 is a frequency equal to or higher than, for example, 700 MHz.

The switching element Q2 is provided between the antenna terminal ANT and an output terminal Rx. The output terminal Rx corresponds to a third terminal which outputs the high frequency signal received by the antenna terminal ANT to a receiving circuit (not illustrated).

The switching element Q3 is connected to the switching element Q1 by a wire 31, and is connected to the ground. The switching element Q4 is connected to the switching element Q2 by a wire 32, and is connected to the ground.

In a case where the semiconductor switch 1 is used for a mobile communication apparatus such as a cellular phone, an element with impedance Z1 is connected to the input terminal Tx, and an element with impedance Z2 is also connected to the antenna terminal ANT. Furthermore, an element with the impedance Z2 is also connected the output terminal Rx. The impedances Z1 to Z3 are the same as the impedance Z0 of the transmission line 20 which will be described.

In the present embodiment, the switching element Q1 to the switching element Q4 form a switch circuit which includes four N-type MOS transistors, each having a gate structure of an N-channel metal oxide semiconductor (MOS) type. Gates of the switching element Q1 and the switching element Q4 are connected to a control terminal Vc1, and gates of the switching element Q2 and the switching element Q3 are connected to a control terminal Vc2.

Operations of the switching element Q1 to the switching element Q4 are controlled according to control signals which are input to the control terminal Vc1 and the control terminal Vc2. When the antenna terminal ANT transmits the high frequency signal, the switching element Q1 and the switching element Q4 are turned on, and the switching element Q2 and the switching element Q3 are turned off. Meanwhile, when the antenna terminal ANT receives the high frequency signal, the switching element Q1 and the switching element Q4 are turned off, and the switching element Q2 and the switching element Q3 are turned on.

The resonant circuit 11 includes an inductor L1 and a capacitor C1 connected in series to the inductor L1 and connected to the ground. An inductance value of the inductor L1 and a capacitance value of the capacitor C1 are set such that their resonance frequency is the same as the frequency f0 of the high frequency signal.

The resonant circuit 12 includes an inductor L2 and a capacitor C2 connected in series to the inductor L2 and connected to the ground. An inductance value of the inductor L2 and a capacitance value of the capacitor C2 are set such that their resonance frequency is the same as a frequency 2f0 (second frequency) twice the frequency f0.

The resonant circuit 13 includes an inductor L3 and a capacitor C3 connected in series to the inductor L3 and connected to the ground. An inductance value of the inductor L3 and a capacitance value of the capacitor C3 are set such that the resonance frequency of the resonant circuit 13 is the same as a frequency 3f0 (third frequency) triple the frequency f0.

One end 20a of the transmission line 20 is connected to the switching element Q1, the switching element Q2, and the antenna terminal ANT. In the present embodiment, the end 20a corresponds to a boundary (node) between the transmission line and the antenna terminal ANT within a region surrounded by the switching element Q1, the switching element Q2, and the antenna terminal ANT, as illustrated in FIG. 2.

Meanwhile, the other end 20b of the transmission line 20 is connected to the resonant circuit 11 and the resonant circuit 12. In the present embodiment, the end 20b corresponds to a portion which is connected in common to the inductor L1 of the resonant circuit 11 and the inductor L2 of the resonant circuit 12, as illustrated in FIG. 2.

A line length from the end 20a to the end 20b of the transmission line 20 corresponds to a quarter of a wavelength λ (λ=1/f0) corresponding to the frequency f0. The line length includes not only λ/4 but also a length of ±20% of λ/4.

In addition, the resonant circuit 13 is connected to a point 20c in which a line length from the end 20a of the transmission line 20 is λ/6. The line length also includes not only λ/6 but also, for example, a length of ±20% of λ/6. In the present embodiment, the transmission line 20 includes one wire (micro strip line), but may include a plurality of wires. For example, the transmission line 20 may include a connection of the first wire provided between the end 20a and the point 20c, to the second wire provided between the point 20c and the end 20b.

In the present embodiment, the switching elements Q1 to Q4, the resonant circuits 11 to 13, and the transmission line 20 are provided on or in a single substrate 40, as illustrated in FIG. 2. In other words, the switching elements, the resonant circuits, and the transmission line are provided on or in a single semiconductor chip. For example, a silicon on insulator (SOI) substrate is used for the substrate 40 so as to reduce capacitance between a signal path and the ground.

Next, an operation of the semiconductor switch according to the present embodiment will be described. Here, an operation at the time of transmitting a high frequency signal from the antenna terminal ANT will be described.

Figure 3:
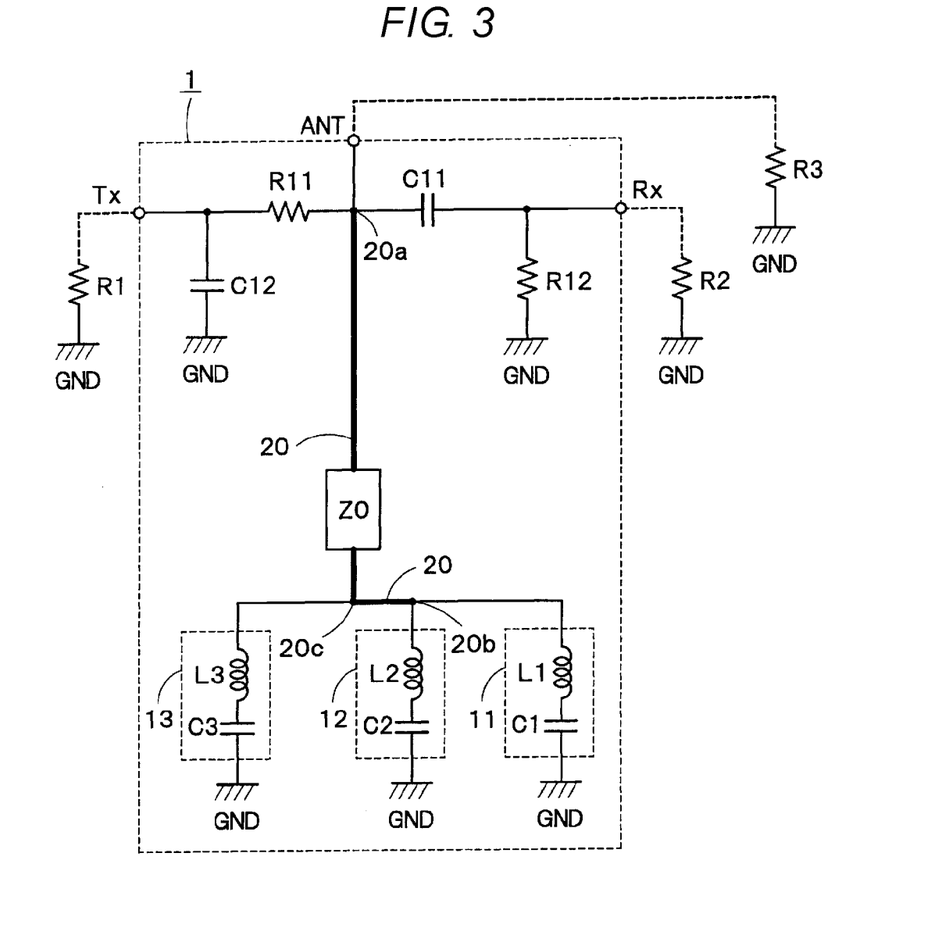
FIG. 3 is an equivalent circuit diagram of the semiconductor switch when a high frequency signal is transmitted.

FIG. 3 is an equivalent circuit diagram of the semiconductor switch 1 when the high frequency signal is transmitted. In the equivalent circuit diagram illustrated in FIG. 3, a resistance element R1 to a resistance element R4 correspond to elements respectively having the impedances Z1 to Z4. Resistance elements R11 and R12 respectively correspond to the switching elements Q1 and Q4 when in an ON state. Capacitors C11 and C12 respectively correspond to the switching elements Q2 and Q3 when in an OFF state.

Figure 4A:
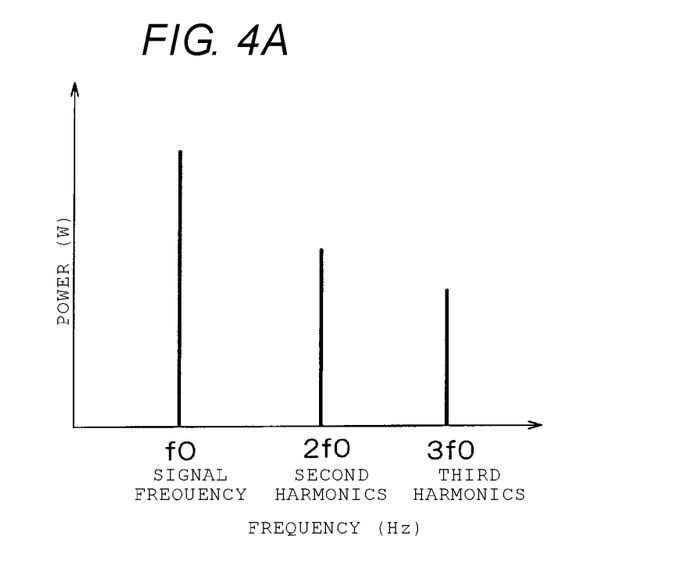
FIGS. 4A and 4B are graphs illustrating intensity distribution of frequency components of the high frequency signal.
Figure 4B:
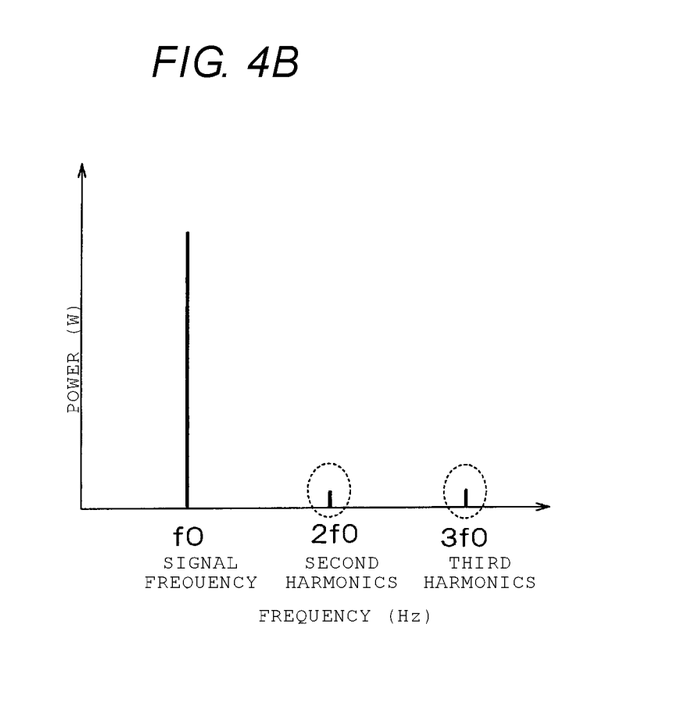

FIG. 4A is a graph illustrating the intensity distribution of frequency components of the high frequency signal in a semiconductor switch in which the resonant circuits 11 to 13 and the transmission line 20 are not provided. FIG. 4B is a graph illustrating the intensity distribution of frequency components of the high frequency signal in a semiconductor switch according to the present embodiment. Vertical axes of FIG. 4A and FIG. 4B denote power (intensity) of frequency components which are obtained by Fourier-transforming the high frequency signal.

As shown in FIG. 3, when the high frequency signal with the frequency f0 is transmitted from the antenna terminal ANT, the high frequency signal is transmitted from the input terminal Tx to the antenna terminal ANT. At this time, the switching elements Q1 and Q4 are turned on, which correspond to the resistance elements R11 and R12 in the schematic of FIG. 3. The switching elements Q2 and Q3 are turned off, which correspond to capacitors C11 and C12 in the schematic of FIG. 3. If the resonant circuits 11 to 13 and the transmission line 20 are not provided in the semiconductor switch 1, the high frequency signal includes not only signal components of the frequency f0 but also second harmonic components whose frequency is 2f0 and third harmonic components whose frequency is 3f0, as illustrated in FIG. 4A.

When the resonant circuits 11 and 13 and the transmission line 20 are provided in the same manner as in the semiconductor switch 1, the second harmonic components and the third harmonic components, which are included in the high frequency signal, are significantly reduced as illustrated in FIG. 4B. Hereinafter, the reason will be described.

If the resonant circuits 11 and 13 are regarded as a load connected to the transmission line 20, impedance Z which is viewed from the load side is represented by the following formula (1). In formula (1), Z0 is impedance (characteristic impedance) of the transmission line 20. Zr is load impedance. 1 is a line length of the transmission line 20. β is a phase coefficient, and a relationship of β=2π/λ is satisfied.

$$Z = Z0 \frac{Zr + jZ0\tan\beta l}{Z0 + jZr\tan\beta l} \quad (1)$$

First, a transmission operation of the signal components of the frequency f0 will be described. Here, the resonant circuit 11 resonates at the frequency f0, and thus, load impedance Zr is approximately zero Ω. Hence, if Zr=0 is substituted in the formula (1), the impedance Z is represented by the following formula (2).

$$Z = jZ0 \tan \beta 1 \quad (2)$$

A line length 1 of the transmission line 20 is λ/4 (λ =1/f0), and thus, if 1=λ/4 is substituted in formula (2), a relationship of Z=j ∞ is satisfied. That is, the impedance Z becomes infinite. Accordingly, the signal transmission line from the input terminal Tx to the antenna terminal ANT is electrically disconnected to the transmission line 20. As a result, the signal components of the frequency f0 are not removed, and are transmitted from the antenna terminal ANT.

Next, a transmission operation of the second harmonic components of the frequency 2f0 will be described. Here, the resonant circuit 12 resonates at the frequency 2f0, and thus, the load impedance Zr is approximately zero Ω. In addition, the line length l is a quarter of a wavelength λ corresponding to the frequency f0, and thus, if the line length is converted by the second harmonic components of the frequency 2f0, the line length becomes λ/2 (2×λ/4). If l=λ/2 is substituted in formula (2), the impedance Z becomes approximately zero. Accordingly, the second harmonic components are substantially transmitted to the resonant circuit 12 through the transmission line 20, and thus, it is possible to significantly reduce the second harmonic components which are included in the high frequency signal.

Finally, a transmission operation of the third harmonic components of the frequency 3f0 will be described. Here, the resonant circuit 13 resonates at 3f0, and thus, the load impedance Zr becomes approximately zero Ω. In addition, the resonant circuit 13 is connected to the point 20c in which a line length from the end 20a is ⅙ of the wavelength λ corresponding to the frequency f0, and thus, the line length l becomes λ/2 (3×λ/6), if the line length is converted by the third harmonic components of the frequency 3f0. If the line length l=λ/2 is substituted in formula (2), the impedance Z becomes approximately zero. Accordingly, the third harmonic components are substantially transmitted to the resonant circuit 13 through the transmission line 20, and thus, it is possible to significantly reduce the third harmonic components which are included in the high frequency signal.

When the high frequency signal input to the antenna terminal ANT is output to the output terminal Rx, the switching elements Q1 and Q4 are turned off, and the switching elements Q2 and Q3 are turned on. In such a case, the circuit of FIG. 1 may be represented by an equivalent circuit illustrated in FIG. 3, in which the resistance elements R11 and R12 replace switching elements Q2 and Q3 in an on state and capacitors C11 and C12 replace switching elements Q1 and Q4 in an off state.

Also in the above equivalent circuit, the impedance Z becomes infinite, and the signal components of the frequency f0 are transmitted from the antenna terminal ANT to the output terminal Rx, in the same manner as described above, when the signal components of the frequency f0 are transmitted. In addition, when the second harmonic components of the frequency 2f0 and the third harmonic components of the frequency 3f0 are transmitted from the antenna terminal ANT, the impedance Z becomes approximately zero, and the harmonic components are transmitted to the resonant circuit 12 or the resonant circuit 13 through the transmission line 20.

According to the present embodiment described above, while the impedance of a circuit which includes the resonant circuits 11 to 13 and the transmission line 20 becomes infinite and becomes approximately zero in a case of the second harmonic components and the third harmonic components. Accordingly, it is possible to significantly reduce the second harmonic components and the third harmonic components in the signal, without affecting the transmission of the signal components.

Second Embodiment

Figure 5:
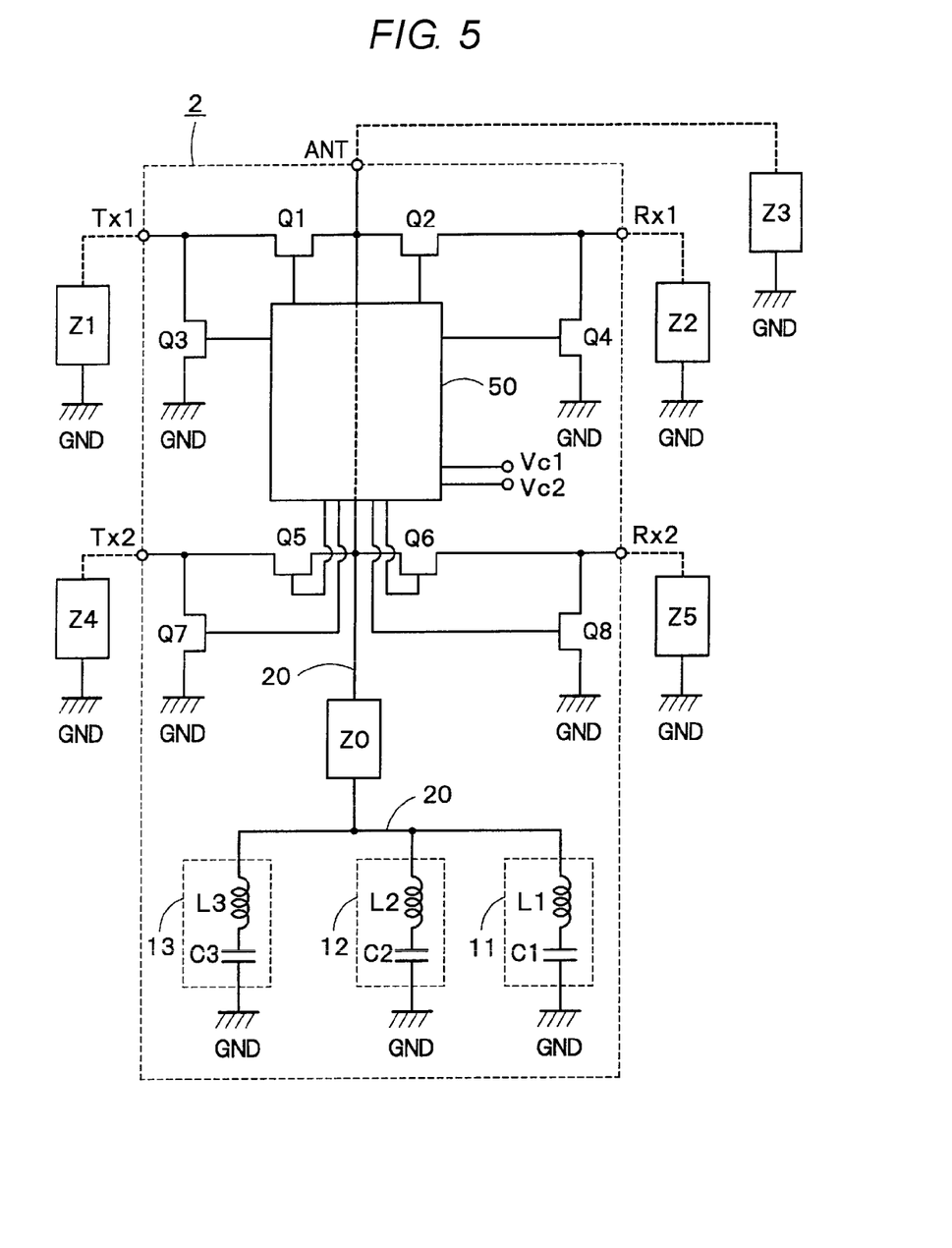
FIG. 5 is a circuit diagram illustrating a schematic configuration of a semiconductor switch according to a second embodiment.

FIG. 5 is a circuit diagram illustrating a schematic configuration of a semiconductor switch according to a second embodiment. The same symbols or reference numerals are attached to the same configuration elements as in the first embodiment, and detailed description thereof will be omitted.

As illustrated in FIG. 5, a semiconductor switch 2 according to the present embodiment includes further switching elements Q5 to Q8 and a control circuit 50, in addition to the configuration elements of the semiconductor switch 1 of the first embodiment.

The switching elements Q5 to Q8 configure a switch circuit which includes four N-type MOS transistors, in the same manner as the switching elements Q1 to Q4. The number of switch circuits is not limited to two, and may be three or more.

In the present embodiment, the switching element Q1 is provided between an input terminal Tx1 and the antenna terminal ANT, and the switching element Q2 is provided between the antenna terminal ANT and an output terminal Rx1. The switching elements Q3 and Q4 have the same connection forms as those of the first embodiment, and thus, description thereof will be omitted.

The switching element Q5 is provided between an input terminal Tx2 and the antenna terminal ANT, and the switching element Q6 is provided between the antenna terminal ANT and an output terminal Rx2. The switching element Q7 is connected between the switching element Q5 and ground. The switching element Q8 is connected between the switching element Q6 and ground.

In the present embodiment, the antenna terminal ANT is connected in common to the switch circuit which includes the switching elements Q1 to Q4 and the switch circuit which includes the switching elements Q5 to Q8. In addition, the input terminal Tx2 is connected to an element having the impedance Z4 which is equal to the impedance Z1, and the output terminal Rx2 is also connected to an element having the impedance Z5 which is equal to the impedance Z1, in the same manner as in the first embodiment.

Gates of the switching elements Q1 to Q8 are connected to the control circuit 50. The control circuit 50 controls the switching elements Q1 to Q8, based on a control signal which is input to the control terminals Vc1 and Vc2. Accordingly, paths of the high frequency signal are switched in the semiconductor switch 2.

In a case where the high frequency signal is transmitted from the input terminal Tx1 to the antenna terminal ANT, the control circuit 50 turns on the switching element Q1, the switching element Q4, the switching element Q7, and the switching element Q8, and turns off the switching element Q2, the switching element Q3, the switching element Q5, and the switching element Q6.

In a case where the high frequency signal is transmitted from the antenna terminal ANT to the output terminal Rx1, the control circuit 50 turns on the switching element Q2, the switching element Q3, the switching element Q7, and the switching element Q8, and turns off the switching element Q1, the switching element Q4, the switching element Q5, and the switching element Q6.

In a case where the high frequency signal is transmitted from the input terminal Tx2 to the antenna terminal ANT, the control circuit 50 turns on the switching element Q5, the switching element Q3, the switching element Q4, and the switching element Q8, and turns off the switching element Q1, the switching element Q2, the switching element Q6, and the switching element Q7.

In a case where the high frequency signal is transmitted from the antenna terminal ANT to the output terminal Rx2, the control circuit 50 turns on the switching element Q6, the switching element Q3, the switching element Q4, and the switching element Q7, and turns off the switching element Q1, the switching element Q2, the switching element Q5, and the switching element Q8.

In the present embodiment, the transmission line 20 and the resonant circuits 11 to 13 are provided between the antenna terminal ANT and ground, in the same manner as in the first embodiment. Accordingly, as described above, when the control circuit 50 controls the switching elements Q1 to Q8, the impedance Z which is viewed from the resonant circuits 11 to 13 side becomes infinite in a case of the frequency f0, and becomes approximately zero in a case of the frequency 2f0 of the second harmonics and the frequency 3f0 of the third harmonics, in the same manner as in the first embodiment.

Hence, it is possible to significantly reduce the second harmonic components and the third harmonic components, without affecting transmission of the signal components, also in the present embodiment.

Third Embodiment

Figure 6:
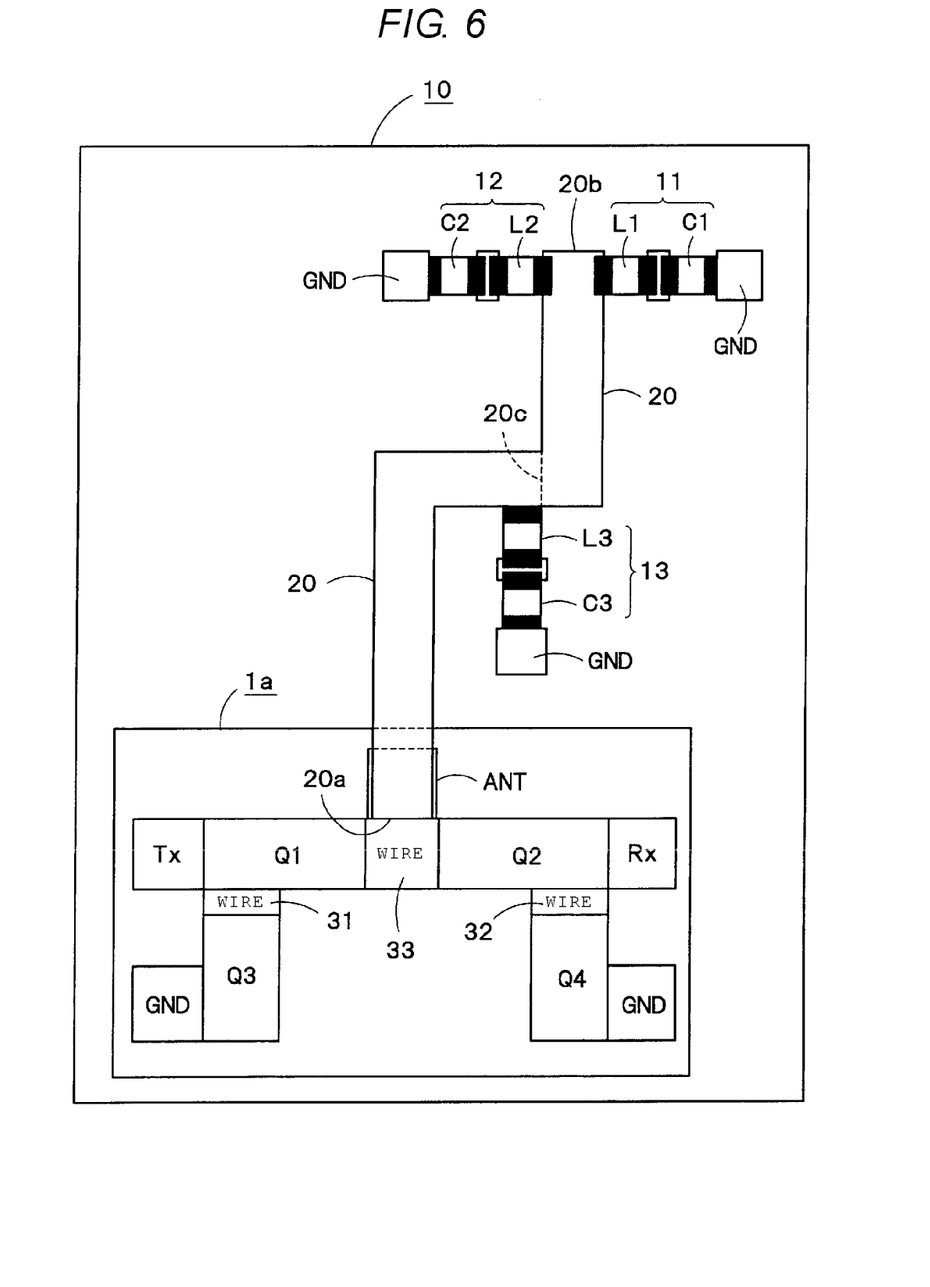
FIG. 6 is a schematic layout diagram of a communication module according to a third embodiment.

FIG. 6 is a schematic layout diagram of a communication module according to a third embodiment. In FIG. 6, the same symbols or reference numerals are attached to the same configuration elements as in the first embodiment described above, and detailed description thereof will be omitted.

As illustrated in FIG. 6, a communication module 10 according to the present embodiment includes a semiconductor switch 1a, the resonant circuits 11 to 13, and the transmission line 20. The semiconductor switch 1a includes the switching elements Q1 to Q4. That is, the communication module 10 is a module to which the resonant circuits 11 to 13 and the transmission line 20 of the configuration elements of the semiconductor switch 1 according to the first embodiment described above are externally attached.

The resonant circuit 11 includes the inductor L1 and the capacitor C1, in the same manner as in the first embodiment. Similarly, the resonant circuit 12 includes the inductor L2 and the capacitor C2, and the resonant circuit 13 includes the inductor L3 and the capacitor C3. In the present embodiment, inductors of a chip type having conductive portions on both terminals thereof and capacitors of a chip type having conductive portions on both terminals thereof are used as the inductors L1 to L3 and capacitors C1 to C3.

The end 20a of the transmission line 20 is connected to a wire 33 across the antenna terminal ANT. The wire 33 connects the switching element Q1 to the switching element Q2.

The other end 20b of the transmission line 20 is connected to the resonant circuit 11 and the resonant circuit 12, in the same manner as in the first embodiment. In the present embodiment, the resonant circuit 11 and the resonant circuit 12 are arranged to face each other adjacent to their ends 20b. Also in the present embodiment, a line length from the end 20a to the end 20b is a quarter of the wavelength λ corresponding to the frequency f0.

Furthermore, the resonant circuit 13 is also connected to the point 20c in which the line length from the end 20a is a sixth of the wavelength λ corresponding to the frequency f0, in the transmission line 20, in the same manner as in the first embodiment.

Also in the communication module 10 having the aforementioned configuration, when the signal components of the frequency f0 are transmitted, the resonant circuit 11 resonates, whereby the load impedance Zr becomes approximately zero Ω, in the same manner as in the first embodiment. In addition, the line length l of the transmission line 20 becomes λ/4, and thus, the impedance Z becomes infinite. As a result, the signal components are transmitted without being affected by the resonant circuit 11.

In addition, even when the second harmonic components of the frequency 2f0 and the third harmonic components of the frequency 3f0 are transmitted, the resonant circuit 12 or the resonant circuit 13 resonate, whereby the load impedance Zr becomes approximately zero Ω, in the same manner as in the first embodiment. In addition, the line length l of the transmission line 20 becomes λ/2, and thus, the impedance Z becomes approximately zero Ω. As a result, the second harmonic components and the third harmonic components are mostly transmitted to the resonant circuit 12 or the resonant circuit 13 through the transmission line 20.

Hence, it is possible to significantly reduce the second harmonic components and the third harmonic components without affecting the transmission of the signal components.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor switch comprising:
   a first switching element connected between a first terminal and a second terminal, the first switching element, when closed, connecting a signal applied to the first terminal to the second terminal;
   a second switching element connected between the second terminal and a third terminal, the second switching element, when closed, connecting a signal received at the second terminal to the third terminal;
   a first resonant circuit having a zero impedance when resonating at a first frequency;
   a second resonant circuit having a zero impedance when resonating at N times the first frequency, wherein N is an integer greater than 1; and
   a transmission line having a first point connected to the second terminal, a second point connected to the first resonant circuit, and a third point connected to the second resonant circuit, wherein a first length of the transmission line between the first and second points corresponds to one-quarter of a wavelength corresponding to the first frequency, and a second length of the transmission line between the first and third points corresponds to one-half of the wavelength corresponding to the first frequency divided by N.

2. The switch according to claim 1, further comprising:
   a third switching element between ground and the first terminal;
   a fourth switching element between ground and the third terminal; and
   a control circuit configured to change the path of the signal in the switch by controlling the first switching element, the second switching element, the third switching element, and the fourth switching element.

3. The switch according to claim 2, wherein the control circuit closes the first and fourth switching elements when the signal is transmitted between the first and second terminals and closes the second and third switching elements when the signal is transmitted between the second and third terminals.

4. The switch according to claim 3, wherein the control circuit opens the second and third switching elements when the signal is transmitted between the first and second terminals and opens the first and fourth switching elements when the signal is transmitted between the second and third terminals.

5. The switch according to claim 1, wherein the first switching element, the second switching element, the first and second resonant circuits, and the transmission line are provided on a single substrate.

6. The switch according to claim 5, wherein the substrate is an SOI substrate.

7. The switch according to claim 1, wherein the first switching element and the second switching element are each a MOS transistor.

8. The switch according to claim 1, further comprising:
   a third resonant circuit having a zero impedance when resonating at M times the first frequency, wherein M is an integer greater than 1 and not equal to N; and
   a transmission line having a fourth point connected to the third resonant circuit, wherein a third length of the transmission line between the first and fourth points corresponds to one-half of the wavelength corresponding to the first frequency divided by M.

9. A communication module comprising:
   a semiconductor switch including a first switching element connected between a first terminal and a second terminal, and a second switching element connected between the second terminal and a third terminal, wherein the second terminal is to be coupled to an antenna through which a signal input through the first terminal is to be transmitted and through which a signal output through the third terminal is to be received;
   a first resonant circuit having a zero impedance when resonating at a first frequency;
   a second resonant circuit having a zero impedance when resonating at N times the first frequency, wherein N is an integer greater than 1;
   a transmission line having a first point connected to the second terminal, a second point connected to the first resonant circuit, and a third point connected to the second resonant circuit, wherein
   a first length of the transmission line between the first and second points corresponds to one-quarter of a wavelength corresponding to the first frequency, and a second length of the transmission line between the first and third points corresponds to one-half of the wavelength corresponding to the first frequency divided by N.

10. The communication module according to claim 9, further comprising:
    a third switching element between ground and the first terminal;
    a fourth switching element between ground and the third terminal; and
    a control circuit configured to change the path of the signal in the switch by controlling the first switching element, the second switching element, the third switching element, and the fourth switching element.

11. The communication module according to claim 10, wherein the control circuit closes the first and fourth switching elements when the signal is transmitted between the first and second terminals and closes the second and third switching elements when the signal is transmitted between the second and third terminals.

12. The communication module according to claim 11, wherein the control circuit opens the second and third switching elements when the signal is transmitted between the first and second terminals and opens the first and fourth switching elements when the signal is transmitted between the second and third terminals.

13. The communication module according to claim 9, wherein the first switching element, the second switching element, the first and second resonant circuits, and the transmission line are provided on a single substrate.

14. The communication module according to claim 13, wherein the substrate is an SOI substrate.

15. The communication module according to claim 9, wherein the first switching element and the second switching element are each a MOS transistor.

16. The communication module according to claim 9, further comprising:
    a third resonant circuit having a zero impedance when resonating at M times the first frequency, wherein M is an integer greater than 1 and not equal to N; and
    a transmission line having a fourth point connected to the third resonant circuit, wherein a third length of the transmission line between the first and fourth points corresponds to one-half of the wavelength corresponding to the first frequency divided by M.

* * * * *